United States Patent

Kikuchi et al.

[11] Patent Number: 5,945,065
[45] Date of Patent: Aug. 31, 1999

[54] METHOD FOR WEDGE BONDING USING A GOLD ALLOY WIRE

[75] Inventors: Teruo Kikuchi, Mitaka, Japan; Mitsuyoshi Ishii, Taipei, Taiwan

[73] Assignee: Tanaka Denshi Kogyo, Japan

[21] Appl. No.: 08/901,466

[22] Filed: Jul. 28, 1997

[30] Foreign Application Priority Data

Jul. 31, 1996 [JP] Japan ................................. 8-202274
Jul. 31, 1996 [JP] Japan ................................. 8-202413

[51] Int. Cl.⁶ ....................................... C22C 5/02
[52] U.S. Cl. ........................... 420/507; 420/508; 420/509; 420/510; 438/617; 228/262.2; 228/904
[58] Field of Search ..................... 420/507, 508, 420/509, 510; 438/617; 228/262.2, 904

[56] References Cited

U.S. PATENT DOCUMENTS

| 5,263,246 | 11/1993 | Aoki ........................................ 438/617 |
| 5,658,664 | 8/1997 | Uno et al. ................................ 420/507 |

FOREIGN PATENT DOCUMENTS

| 53-105968 | 9/1978 | Japan . | |
| 53-112060 | 9/1978 | Japan . | |
| 59-181040 | 10/1984 | Japan . | |
| 64-78698 | 3/1989 | Japan ................................. | C22C 5/02 |
| 1-198438 | 8/1989 | Japan ................................. | C22C 5/02 |
| 2-219249 | 8/1990 | Japan ................................. | C22C 5/02 |
| 2-219251 | 8/1990 | Japan ................................. | C22C 5/02 |
| 2205641 | 8/1990 | Japan . | |
| 2-250934 | 10/1990 | Japan ................................. | C22C 5/02 |
| 2-259034 | 10/1990 | Japan ................................. | C22C 5/02 |
| 3-130337 | 6/1991 | Japan ................................. | C22C 5/02 |
| 3-264628 | 11/1991 | Japan ................................. | C22C 5/02 |
| 5-179375 | 7/1993 | Japan ................................. | C22C 5/02 |
| 6-33168 | 2/1994 | Japan ................................. | C22C 5/02 |
| 06112251 | 4/1994 | Japan . | |
| 06112252 | 4/1994 | Japan . | |
| 06112253 | 4/1994 | Japan . | |
| 06112254 | 4/1994 | Japan . | |
| 06112255 | 4/1994 | Japan . | |
| 06112256 | 4/1994 | Japan . | |
| 06112257 | 4/1994 | Japan . | |
| 06112258 | 4/1994 | Japan . | |
| 06112259 | 4/1994 | Japan . | |
| 6-108181 | 4/1994 | Japan ................................. | C22C 5/02 |
| 6-145842 | 4/1994 | Japan ................................. | C22C 5/02 |
| 07045657 | 2/1995 | Japan . | |
| 7305126 | 11/1995 | Japan . | |
| 1363042 | 8/1974 | United Kingdom . | |
| 2245902 | 1/1992 | United Kingdom ............. | C22C 5/02 |
| 2276632 | 10/1994 | United Kingdom ............. | C22C 5/02 |

OTHER PUBLICATIONS

Japanese Patent Abstract No. JP61189652, Publication Date 1986, p. 1/1.
Japanese Patent Abstract No. JP01078698, Publication Date 1989, p. 1/1.
Japanese Patent Abstract No. JP02219250, Publication Date 1990, p. 1/1.
Japanese Patent Abstract No. JP05009624, Publication Date 1993, p. 1/1.

*Primary Examiner*—Deborah Yee
*Attorney, Agent, or Firm*—Christie, Parker & Hale, LLP

[57] ABSTRACT

A gold alloy wire for wedge bonding, comprising 1 to 100 parts per million by weight of calcium (Ca), the remainder being gold and inevitable impurities, said gold alloy wire having a tensile strength of not less than 33.0 kg/mm² and an elongation of 1 to 3%. The gold alloy wire has a gold purity of not less than 99.9% or further comprises 0.2 to 5.0% by weight of at least one element selected from the group consisting of Pd, Ag and Pt.

11 Claims, 3 Drawing Sheets

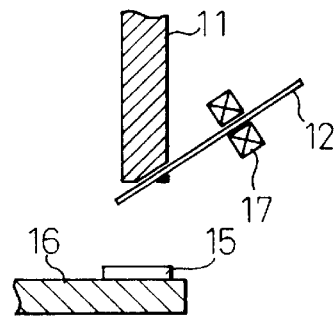
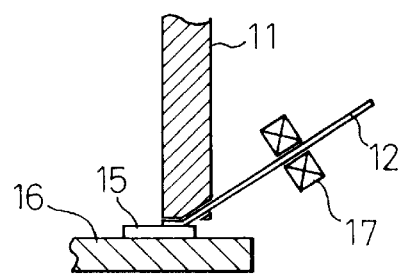
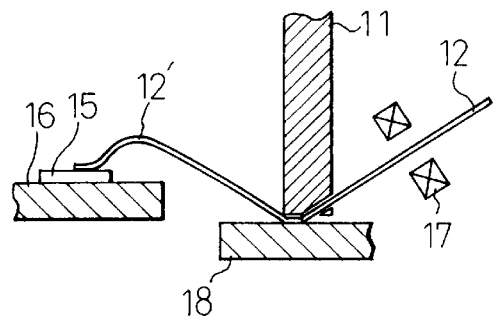
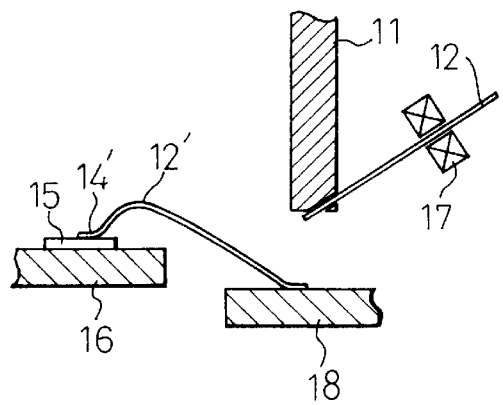

METHOD FOR WEDGE BONDING USING A GOLD ALLOY WIRE

BACKGROUND OF THE INVENTION

1. Field of the Invention

The present invention relates to a gold alloy wire for wedge bonding and a use of said gold alloy wire in wedge bonding.

2. Description of the Related Art

A wire bonding method is known to connect electrodes of an IC chip with outer terminals and the like through wires. The wire bonding method includes among others a ultrasonic and thermal pressing bonding and a ultrasonic bonding, classified by the method of bonding a wire to an electrode of an IC chip.

A typical ultrasonic and thermal pressing bonding is a nail head bonding method. The nail head bonding method is illustrated in FIGS. 1A to 1D.

Referring to FIG. 1A, a wire 2 is arranged through a capillary 1, a torch 3 faces a tip of the wire 2, and an electric discharge is generated between the torch 3 and the wire 2 to heat and melt the tip of the wire 2 to thus form a ball 4.

Referring to FIG. 1B, the capillary 1 is lowered and the ball 4 is pressed to an Al electrode 5 of an IC chip 6. At this time, ultrasonic waves are applied to the ball 4 through the capillary 1 and the IC chip 6 is heated by a heater block, so that the ball 4 is thermally pressed and bonded to the electrode 5 and becomes a bonded ball 4'.

Referring to FIG. 1C, the capillary 1 is moved through a certain route (wire 2') toward above an outer lead 8 and is then lowered to the outer lead 8. At this time, ultrasonic waves are applied to the wire 2 through the capillary 1 and the outer lead is heated by a heater block, so that side sections of the wire are thermally pressed and bonded to the lead 8.

Referring to FIG. 1D, a damper 7 is lifted while clamping the wire 2 so that the wire 2 is cut, and thus the wire bonding is finished.

On the other hand, a typical ultrasonic bonding method is a wedge bonding method using a wedge bonding tool.

Referring to FIG. 2A, a wire 12 is arranged through a lower end of a wedge bonding tool 11 and an Al electrode 15 of an IC chip 16 is moved below the wedge bonding tool 11.

Referring to FIG. 2B, the wedge bonding tool 11 is then lowered and ultrasonic waves are applied at room temperature, i.e. without heating, to the wedge bonding tool 11 to the pressed wire 12, to bond the wire 12 to the Al electrode 15 of the IC chip 16.

Referring to FIG. 2C, a clamper 12 releases the wire and the wedge bonding tool 11 is moved through a certain route (wire 12') to above an outer lead 18 and then lowered onto the outer lead 18. At this time, ultrasonic waves are again applied to the wire 12 at room temperature through the wedge bonding tool 11, to bond the wire 12 to the outer lead 18.

Referring to FIG. 2D, a clamper 17 is lifted while clamping the wire 12 so that the wire 12 is cut, and thus the wire bonding is finished.

The above nail head bonding method is preferred since it is excellent in productivity, but it is used in combination with a gold alloy wire since it involves heat and it is not suitable for an aluminum alloy wire which is easily oxidized when heated.

Further, as shown in FIG. 3A, the ball 4' has a diameter $L_1$ three to four times larger than the diameter D of the wire 2', which prevents fine wiring.

The wedge bonding is used using an aluminum alloy wire since it can be done at room temperature although its productivity is not high. The wedge bonding however has an advantage that the width $L_2$ of the deformed wire 14' can be only 1.5 to 2.5 times the diameter of the wire 12', as shown in FIG. 3B.

However, the gold alloy wire is the most preferable material as a wiring material for providing reliability against corrosion in a semiconductor device, since the gold alloy wire is more excellent in resistance against corrosion than other wire materials.

On the one hand, dense wiring is demanded in recent semiconductor devices. To attain this, it is required that the width of the bonded portion of the gold alloy wire with an IC chip electrode is reduced (the width here means the length in the direction perpendicular to the length of the wire).

In this respect, reduction of the width or diameter of the bonded ball has been attempted in nail head bonding using a gold alloy wire, but it has a certain limitation.

The inventors, considering the above problems and demands, have tried wedge bonding to an IC chip electrode using gold alloy wires which have been used or proposed for nail head bonding. It was revealed that although the width of the bonded portion of the wire may be reduced in comparison with the nail head bonding, the bond strength at the bonded portion of the wire at high temperatures (hereinafter called "high temperature bond strength") which is necessary in practical semiconductor devices during operation thereof, was low and the reliability of semiconductor devices was lowered.

Therefore, the object of the present invention is to provide a gold alloy wire, which can be used in wedge bonding to IC chip electrodes to reduce the width of the bonded portion of the wiring and is thus adapted to high density wiring, and which has an improved high temperature bond strength and thus allows an increased reliability of semiconductor devices.

SUMMARY OF THE INVENTION

The present inventors, after vigorous investigation, have found that by adding a predetermined amount of Ca to a high purity gold and maintaining a predetermined gold purity or further adding a predetermined amount of at least one of Pd, Ag and Pt, and by reducing elongation and improving tensile strength compared to those of conventional nail head bonding gold alloy wires, the resultant gold alloy wire can attain the above objects by the synergistic effect of the above composition and of the mechanical properties of the wire.

More specifically, the present invention broadly provides a gold alloy wire for wedge bonding, comprising 1 to 100 parts per million by weight of calcium (Ca), the remainder being gold (Au), said gold alloy wire having a tensile strength of not less than 33.0 kg/mm² and an elongation of 1 to 3%.

In preferred embodiments, there are provided the following two embodiments.

(1) The first embodiment is a gold alloy wire for wedge bonding comprising 1 to 100 parts per million by weight of calcium (Ca), the remainder being gold (Au), said gold alloy wire having a purity of gold of at least 99.9% by weight, said gold alloy wire having a tensile strength of not less than 33.0 kg/mm² and an elongation of 1 to 3%.

This gold alloy wire may further comprise at least one element selected from the group consisting of magnesium (Mg), yttrium (Y), lanthanum (La), europium (Eu), germanium (Ge), silver (Ag) and platinum (Pt) in an amount of 1 to 100 parts per million by weight and/or Be in an amount of 1 to 20 parts per million by weight.

(2) The second embodiment is a gold alloy wire for wedge bonding consisting of 1 to 100 parts per million by weight of calcium (Ca) and 0.2 to 5.0% by weight of at least one element selected from the group consisting of paradium (Pd), silver (Ag) and platinum (Pt), the remainder being gold (Au) and inevitable impurities, said gold alloy wire having a tensile strength of not less than 33.0 kg/mm$^2$ and an elongation of 1 to 3%.

This gold alloy wire may further comprise at least one element selected from the group consisting of magnesium (Mg), yttrium (Y), lanthanum (La), europium (Eu), germanium (Ge) and beryllium (Be) in an amount of 1 to 100 parts per million by weight.

The gold alloy wire of the present invention is used in wedge bonding and thus, in accordance with another aspect of the present invention, there is also provided use of the above gold alloy wire in wedge bonding.

The wedge bonding may comprise the steps of: press bonding an end of said gold alloy wire to an electrode of a semiconductor chip by a wedge bonding tool, and press bonding another end of the gold alloy wire to a lead or another electrode by a wedge bonding tool; more specifically, the steps may comprise: arranging a portion of a gold alloy wire under a wedge bonding tool, pressing said portion of said gold alloy wire to an electrode of a semiconductor chip by said wedge bonding tool to bond said portion of said gold alloy wire to said electrode, relatively moving said wedge bonding tool with said gold alloy wire through a position above said electrode of said semiconductor chip toward a position above a lead or another electrode, to form the gold alloy wire in a certain shape from said electrode to said lead or another electrode, another portion of said gold alloy wire existing under said wedge bonding tool, and pressing said another portion of said gold alloy wire to said lead or another electrode by said wedge bonding tool to bond said another portion of said gold alloy wire to said lead or another electrode.

Therefore, there is also provided a semiconductor device in which electrodes of a semiconductor chip and outer leads or other electrodes are connected through gold wires which are bonded to the electrodes and to the outer leads or other electrodes by wedge bonding.

BRIEF DESCRIPTION OF THE DRAWINGS

FIGS. 2A, 2B, 2C, and illustrate a typical process of the wedge bonding; and

DESCRIPTION OF THE PREFERRED EMBODIMENTS OF THE INVENTION

Figure 1A:
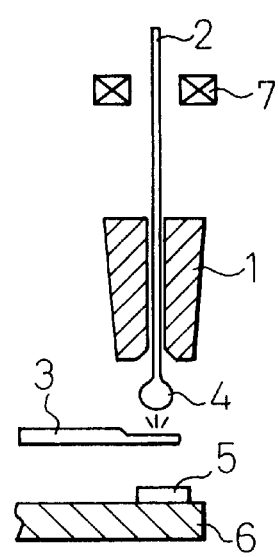
FIGS. 1A, 1B 1C, and 1D illustrate a typical process of the nail head bonding.
Figure 1B:
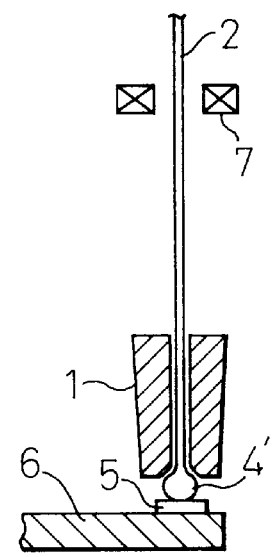
Figure 1C:
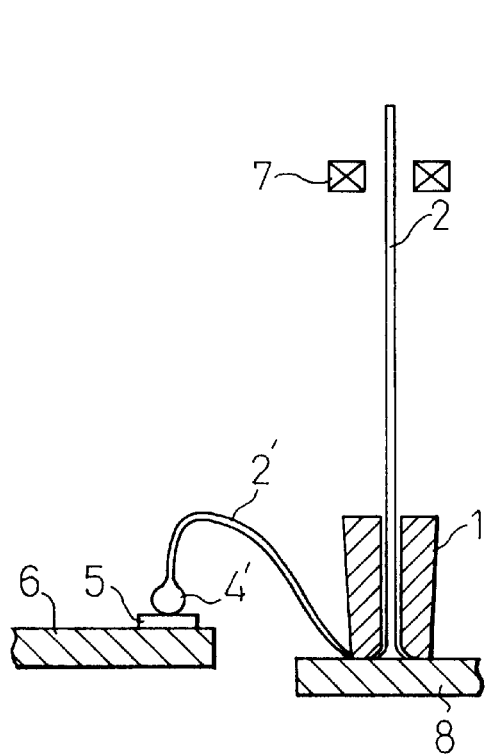
Figure 1D:
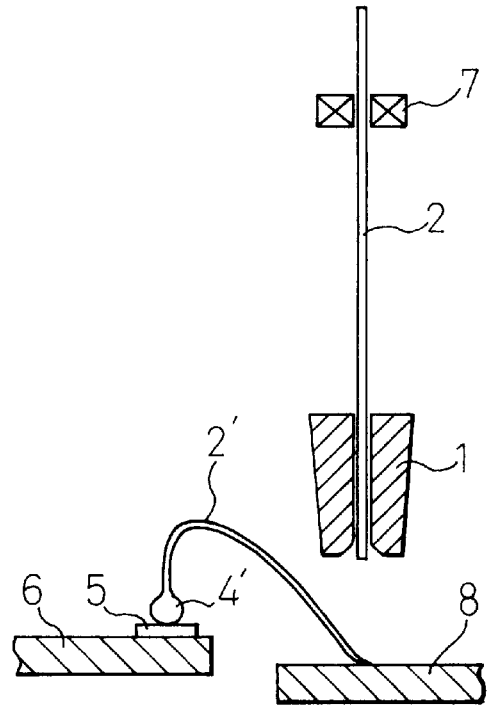
Figure 3A:
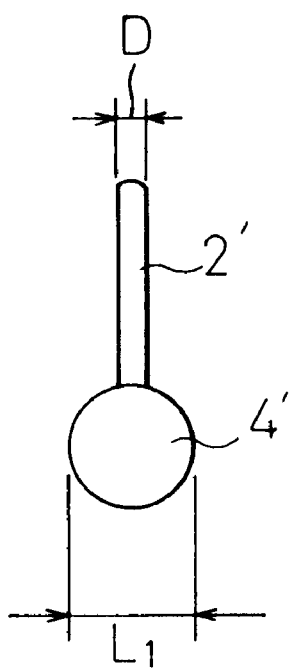
FIGS. 3A and 3B show the relationship between the width of the bonded portion of the wire and the method of bonding.
Figure 3B:
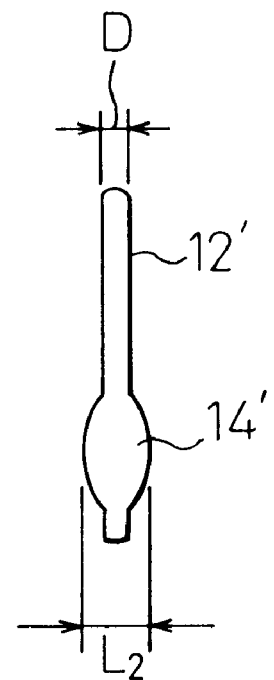

In accordance with the present invention, a predetermined amount of Ca is added to a high purity gold, and the elongation is reduced and the tensile strength is increased. Further, the gold purity of the wire is kept to be not less than 99.9% (first embodiment) or a predetermined amount of at least one of Pd, Ag and Pt is further added (second embodiment).

In the present invention, the high temperature bond strength is improved by the synergistic effect of the above composition of the predetermined amount of Ca and the certain gold purity or the predetermined amount of at least one of Pd, Ag and Pt as well as the above mechanical properties.

The starting high purity gold used in the present invention should preferably be a gold purified to have a purity of at least 99.99% by weight, preferably at least 99.995% by weight, more preferably at least 99.999% by weight.

If the content of Ca is less than 1 ppm by weight, the high temperature bond strength is lowered in comparison with the case of not less than 1 ppm by weight of Ca. If the content of Ca is more than 100 ppm by weight, an IC chip may have cracks and, to prevent such cracks, insufficient bonding may be conducted so that the high temperature bond strength is again lowered. Therefore, the content of Ca should be in a range of 1 to 100 ppm by weight, preferably 1 to 50 ppm by weight, under the conditions of the predetermined elongation and tensile strength, together with the predetermined gold purity or the predetermined content of at least one of Pd, Ag and Pt.

In the first embodiment of the present invention, a predetermined amount of Ca and the gold purity is kept to a predetermined level, and the elongation is reduced and the tensile strength is increased.

In this embodiment, the high temperature bond strength is improved by the synergistic effect of setting the elongation and tensile strength to predetermined ranges as well as of adding the predetermined amount of Ca and keeping the predetermined gold purity of the wire.

It is, of course, possible in the first embodiment that the gold alloy wire has a composition consisting of the predetermined amount of Ca, the remainder being only gold and inevitable impurities.

Here, when 1 to 2% by weight of Cu, for example, is added to the wire while the predetermined amount of Ca is added and the predetermined elongation and tensile strength are established, the high temperature bond strength is lowered and, if it tries to give a high bond strength, cracks appear in a chip bonded with the wire. To avoid this type of problem, the gold purity of the wire is set to be not less than 99.9%. Of course, it is preferably not less than 99.97%, more preferably not less than 99.979%.

This can be easily attained by using high purity gold starting material and additives. The used additives may have a purity of not less than 99.999% by weight, more preferably not less than 99.999% by weight. Thus, the total impurity concentration of the wire can be reduced to less than 0.1%, preferably less than 0.03%, more preferably less than 0.021%, most preferably less than 0.005%.

However, the above effect of the present invention, more specifically of the first embodiment thereof, may be also obtained even if any additives other than Ca are further added, as long as the gold purity of the wire is kept to be not less than 99.9% while the predetermined amount of Ca is added and the wire has the predetermined elongation and tensile strength.

Particularly, when at least one of Mg, Y, La, Eu, Ge, Ag and Pt in an amount of 1 to 100 ppm by weight and/or Be in an amount of 1 to 20 ppm by weight, in addition to 1 to 100 ppm by weight of Ca, are added, the high temperature bond strength is further improved.

If the predetermined amount of at least one of Mg, Y, La, Eu, Ge, Ag and Pt is added but the predetermined amount of Ca is not added, the high temperature bond strength is lowered even if the predetermined purity of the gold is maintained and the predetermined elongation and tensile strength are established.

In the second embodiment of the present invention, a predetermined amount of Ca and a predetermined amount of at least one of Pd, Ag and Pt are added to a high purity gold, and the elongation is reduced and the tensile strength is increased.

In this embodiment, the high temperature bond strength is improved by the synergistic effect of setting the elongation and tensile strength to predetermined ranges as well as of adding the predetermined amount of Ca and the predetermined amount of at least one of Pd, Ag and Pt.

If the content of at least one of Pd, Ag and Pt is less than 0.2% by weight, the high temperature bond strength is lowered in comparison with the case of not less than 0.2% by weight of at least one of Pd, Ag and Pt added. If the content of at least one of Pd, Ag and Pt is more than 5.0% by weight, an IC chip may have cracks and, to prevent such cracks, insufficient bonding may be done so that the high temperature bond strength is again lowered. Therefore, the content of at least one of Pd, Ag and Pt should be in a range of 0.2 to 5.0% by weight, preferably 1.0 to 3.0% by weight, under the conditions of the predetermined elongation and tensile strength.

If the predetermined amount of at least one of Pd, Ag and Pt is added but the predetermined amount of Ca is not added, the high temperature bond strength is lowered even if the predetermined elongation and tensile strength are established.

It is of course possible in the second embodiment that the gold alloy wire has a composition consisting of the predetermined amount of Ca and the predetermined amount of at least one of Pd, Ag and Pt, the remainder being only gold and inevitable impurities.

However, the above effect may be also obtained and even further improved when at least one of Mg, Y, La, Eu, Ge and Be in an amount of 1 to 100 ppm by weight is further added, as long as the predetermined amount of Ca and the predetermined amount of at least one of Pd, Ag and Pt are added and the wire has the predetermined elongation and tensile strength.

Here, it is preferable in the second embodiment that the total impurity concentration of the wire is controlled in the same manner as in the first embodiment except that 0.2 to 5.0% by weight of the gold is replaced with at least one of Pd, Ag and Pt. The total impurity concentration of the wire is preferably less than 100 ppm, more preferably less than 20 ppm, by controlling the purities of the starting materials (not less than 99.99%, more preferably not less than 99.999%).

In the present invention including the first and second embodiments, the high temperature bond strength is improved by the synergistic effect of setting the elongation and tensile strength to predetermined ranges as well as of adding the predetermined amount of Ca and keeping the predetermined gold purity or adding further the predetermined amount of at least one of Pd, Ag and Pt.

If the elongation is more than 3%, the high temperature bond strength is lowered even if the predetermined amount of Ca is added and the predetermined gold purity is kept or the predetermined amount of at least one of Pd, Ag and Pt is also added as well as the tensile strength is set within a predetermined range. If the elongation is less than 1%, a desired improvement of the high temperature bond strength is not attained. Thus, the elongation is set to a range of 1 to 3%, with the preferred range being 2 to 3%.

Here, the elongation (%) is measured at room temperature using a tensile test device in which a gold alloy wire is clamped with a span of 100 mm and is drawn at a rate of 10 mm/min. The amount of the elongation (length) at rupture is determined and the elongation (%) is calculated by the following formula:

$$\text{Elongation (\%)} = \frac{\text{Amount of elongation at rupture (mm)}}{100 \text{(mm)}} \times 100$$

The amount of elongation (length) is preferably determined using the elongation vs applied load curve of the chart obtained in the above measurement.

If the tensile strength is less than 33.0 kg/mm$^2$, the high temperature bond strength is lowered in comparison with the case of not less than 33.0 kg/mm$^2$, even if the predetermined amount of Ca is added, and the predetermined gold purity is kept or the predetermined amount of at least one of Pd, Ag and Pt is added, as well as the elongation is set within a predetermined range. Thus, the tensile strength is set to a range of not less than 33.0 kg/mm$^2$, preferably 33.0 to 70.0 kg/mm$^2$, more preferably 33.0 to 63.0 kg/mm$^2$, most preferably 39.1 to 63.0 kg/mm$^2$.

The method for preparing the gold alloy wire of the present invention is described below.

A high purity gold is added with a predetermined amount (s) of an element(s), is melted in a vacuum furnace, and is cast to obtain an ingot. The ingot is subjected to cold working, using a grooved roll and a wire drawing machine, and intermediate annealing, to obtain a raw wire; then a final cold working to obtain a fine wire having a diameter of 10 to 100 μm; and then final annealing.

In the case of the alloy composition of the present invention, there is a region of temperature where as the temperature of the final annealing is elevated, the tensile strength is gradually lowered while the elongation is constant in a range of 1 to 3%. Further, the tensile strength of the wire may be varied depending on the degree of the final cold working. Therefore, the elongation and tensile strength can be adjusted by controlling the degree of the final cold working and the temperature of the final annealing.

Thus, the final annealing is conducted in a temperature range where the elongation is maintained to be 1 to 3% and the tensile strength is made to be not less than 33.0 kg/mm$^2$, preferably 33.0 to 70.0 kg/mm$^2$. If the temperature of the annealing is further elevated, the elongation becomes more than 3% and the tensile strength falls.

Gold alloy wires which have been used for nail head bonding have an elongation of 4% or more. In contrast, in the present invention, in order to obtain a predetermined tensile strength and an elongation of 1 to 3%, the degree of the final cold working is adjusted and the temperature for the final annealing is also lowered while considering the alloy composition.

The reasons why the high temperature bond strength is excellent when the gold alloy wire of the present invention is wedge bonded to an electrode of an IC chip, are not clear. However, it is considered that addition of Ca, the regulated content of impurities or addition of at least one of Pd, Ag and Pt, and prevention of unnecessary deformation of the material during the wedge bonding with ultrasonic waves due to the small elongation and the large tensile strength, make the formed Au-Al intermetallic compound thermally stable.

The gold alloy wire of the present invention is suitable for wedge bonding. Wedge bonding means bonding wiring between an Al electrode of an IC chip and an outer lead or another electrode, in which bonding of the wire to the electrode and to a lead or another electrode is conducted by press-bonding side sections of the wire to the outer lead or another electrode by means of a wedge bonding tool without forming a ball in the first and second bondings. Optionally, ultrasonic waves are applied to the bonding portion of the wire through the wedge bonding tool.

EXAMPLES (Example 1)

To a high purity gold having a purity of 99.999% by weight, a predetermined amount of Ca was added and the mixture was melted in a vacuum furnace to cast a gold ingot having the composition as shown in Table 1, i.e., a purity of gold of 99.988% by weight or more with 1 ppm by weight of Ca. The gold ingot was subjected to cold working using grooved rollers and a wire-drawer, and then to intermediate annealing to obtain a wire having a diameter of 25 μm. This wire was then subjected to a final annealing to obtain a gold alloy wire having a tensile strength of 40.8 kg/mm² and an elongation of 2 to 3%.

Using a wedge bonding apparatus (Shikawa SWB-FA-US30), this gold alloy wire was bonded onto Al electrodes of IC chips and onto outer leads by the method as shown in FIGS. 2A to 2D, with ultrasonic waves being applied. The conditions of bonding on the side of the IC chip were 45 g of bonding load, 30 ms of bonding time and 0.64W of bonding power.

The thus obtained ten samples were kept in an oven at 200° C. for 100 hours. The samples were removed from the oven and the wires were cut at an outer lead side thereof to determine the high temperature bond strength of the IC chip side. That is, the IC ship was fixed by a jig and the wire was lifted and the load at rupture was determined. The value of the high temperature bond strength as shown in Table 1 is an average of the measured values of ten samples.

(Examples 2 to 71 and Comparative Examples 1 to 11)

Example 1 was repeated but the compositions of the gold and gold alloy wire, the elongation and the tensile strength were changed as shown in Tables 1 to 4. The high temperature bond strengths measured for the obtained wires are shown in Tables 1 to 5.

TABLE 1

| | Composition (wt ppm) | | | | | | | | | (wt %) | Mechanical strength | | Evaluation |
|---|---|---|---|---|---|---|---|---|---|---|---|---|---|
| | | | | | | | | | | | Tensile strength | Elongation | High temperature bond strength |
| Ex. No. | Ca | Mg | Y | La | Eu | Ge | Ag | Pt | Be | Au | (kg/mm²) | (%) | (g) |
| Ex. 1 | 1 | — | — | — | — | — | — | — | — | ≧99.9989 | 40.8 | 2–3 | 3.2 |
| Ex. 2 | 10 | — | — | — | — | — | — | — | — | ≧99.998 | 39.5 | 2–3 | 3.3 |
| Ex. 3 | 50 | — | — | — | — | — | — | — | — | ≧99.994 | 41.4 | 2–3 | 3.3 |
| Ex. 4 | 100 | — | — | — | — | — | — | — | — | ≧99.989 | 39.3 | 2–3 | 3.0 |
| Ex. 5 | 10 | 1 | — | — | — | — | — | — | — | ≧99.9979 | 40.4 | 2–3 | 4.7 |
| Ex. 6 | 10 | 50 | — | — | — | — | — | — | — | ≧99.993 | 39.3 | 2–3 | 4.6 |
| Ex. 7 | 10 | 100 | — | — | — | — | — | — | — | ≧99.988 | 39.8 | 2–3 | 4.5 |
| Ex. 8 | 1 | 50 | — | — | — | — | — | — | — | ≧99.9939 | 40.2 | 2–3 | 4.5 |
| Ex. 9 | 100 | 50 | — | — | — | — | — | — | — | ≧99.984 | 39.7 | 2–3 | 4.3 |
| Ex. 10 | 10 | — | 1 | — | — | — | — | — | — | ≧99.9979 | 40.1 | 2–3 | 4.8 |
| Ex. 11 | 10 | — | 50 | — | — | — | — | — | — | ≧99.993 | 41.2 | 2–3 | 4.7 |
| Ex. 12 | 10 | — | 100 | — | — | — | — | — | — | ≧99.988 | 40.2 | 2–3 | 4.6 |
| Ex. 13 | 1 | — | 50 | — | — | — | — | — | — | ≧99.9939 | 40.1 | 2–3 | 4.6 |
| Ex. 14 | 100 | — | 50 | — | — | — | — | — | — | ≧99.984 | 40.5 | 2–3 | 4.2 |
| Ex. 15 | 10 | — | — | 1 | — | — | — | — | — | ≧99.9979 | 39.7 | 2–3 | 4.6 |
| Ex. 16 | 19 | — | — | 50 | — | — | — | — | — | ≧99.993 | 39.5 | 2–3 | 4.9 |
| Ex. 17 | 10 | — | — | 100 | — | — | — | — | — | ≧99.988 | 41.3 | 2–3 | 4.7 |
| Ex. 18 | 10 | — | — | — | 1 | — | — | — | — | ≧99.9979 | 39.1 | 2–3 | 4.7 |
| Ex. 19 | 10 | — | — | — | 50 | — | — | — | — | ≧99.993 | 40.4 | 2–3 | 5.0 |
| Ex. 20 | 10 | — | — | — | 100 | — | — | — | — | ≧99.988 | 40.7 | 2–3 | 4.8 |

TABLE 2

| | Composition (wt ppm) | | | | | | | | | (wt %) | Mechanical strength | | Evaluation |
|---|---|---|---|---|---|---|---|---|---|---|---|---|---|
| | | | | | | | | | | | Tensile strength | Elongation | High temperature bond strength |
| Ex. No. | Ca | Mg | Y | La | Eu | Ge | Ag | Pt | Be | Au | (kg/mm²) | (%) | (g) |
| Ex. 10 | 10 | — | — | — | — | 1 | — | — | — | ≧99.9979 | 41.5 | 2–3 | 4.6 |
| Ex. 22 | 10 | — | — | — | — | 50 | — | — | — | ≧99.993 | 40.6 | 2–3 | 5.0 |
| Ex. 23 | 10 | — | — | — | — | 100 | — | — | — | ≧99.988 | 39.2 | 2–3 | 4.9 |
| Ex. 24 | 10 | — | — | — | — | — | 50 | — | — | ≧99.993 | 41.4 | 2–3 | 4.8 |
| Ex. 25 | 10 | — | — | — | — | — | — | 50 | — | ≧99.993 | 41.2 | 2–3 | 4.9 |
| Ex. 26 | 10 | 25 | 25 | — | — | — | — | — | — | ≧99.993 | 41.3 | 2–3 | 4.8 |
| Ex. 27 | 10 | 25 | — | 25 | — | — | — | — | — | ≧99.993 | 39.6 | 2–3 | 4.9 |
| Ex. 28 | 10 | 25 | — | — | 25 | — | — | — | — | ≧99.993 | 39.4 | 2–3 | 4.6 |
| Ex. 29 | 10 | — | 25 | 25 | — | — | — | — | — | ≧99.993 | 40.6 | 2–3 | 4.9 |
| Ex. 30 | 10 | — | 25 | — | 25 | — | — | — | — | ≧99.993 | 41.1 | 2–3 | 5.0 |
| Ex. 31 | 10 | — | 25 | — | — | 25 | — | — | — | ≧99.993 | 39.5 | 2–3 | 4.8 |

TABLE 2-continued

| | Composition | | | | | | | | | | Mechanical strength | | Evaluation |
| | (wt ppm) | | | | | | | | | (wt %) | Tensile | | High temperature |
| Ex. No. | Ca | Mg | Y | La | Eu | Ge | Ag | Pt | Be | Au | strength (kg/mm$^2$) | Elongation (%) | bond strength (g) |
|---|---|---|---|---|---|---|---|---|---|---|---|---|---|
| Ex. 32 | 10 | — | — | 25 | 25 | — | — | — | — | ≧99.993 | 39.4 | 2–3 | 4.9 |
| Ex. 33 | 10 | — | — | 25 | — | — | 25 | — | — | ≧99.993 | 41.4 | 2–3 | 4.9 |
| Ex. 34 | 10 | — | — | — | 25 | 25 | — | — | — | ≧99.993 | 40.1 | 2–3 | 5.1 |
| Ex. 35 | 10 | — | — | — | 25 | — | 25 | — | — | ≧99.993 | 41.6 | 2–3 | 4.8 |
| Ex. 36 | 10 | — | — | — | — | 25 | 25 | — | — | ≧99.993 | 41.2 | 3–3 | 4.6 |
| Ex. 37 | 10 | — | — | — | — | — | 25 | 25 | — | ≧99.993 | 40.0 | 2–3 | 4.8 |
| Ex. 38 | 10 | 20 | 20 | 20 | — | — | — | — | — | ≧99.992 | 40.4 | 2–3 | 4.9 |
| Ex. 39 | 10 | 20 | 20 | — | — | 20 | — | — | — | ≧99.992 | 41.3 | 2–3 | 5.1 |
| Ex. 40 | 10 | 20 | 20 | — | — | — | — | 20 | — | ≧99.992 | 39.5 | 2–3 | 5.0 |

TABLE 3

| | Composition | | | | | | | | | | Mechanical strength | | Evaluation |
| | (wt ppm) | | | | | | | | | (wt %) | Tensile | | High temperature |
| Ex. No. | Ca | Mg | Y | La | Eu | Ge | Ag | Pt | Be | Au | strength (kg/mm$^2$) | Elongation (%) | bond strength (g) |
|---|---|---|---|---|---|---|---|---|---|---|---|---|---|
| Ex. 41 | 10 | — | — | — | 20 | 20 | 20 | — | — | ≧99.992 | 39.6 | 2–3 | 4.9 |
| Ex. 42 | 10 | — | — | — | 20 | 20 | — | 20 | — | ≧99.992 | 41.3 | 2–3 | 4.8 |
| Ex. 43 | 10 | — | 10 | 10 | 10 | 10 | — | — | — | ≧99.994 | 40.8 | 2–3 | 5.0 |
| Ex. 44 | 10 | 10 | 10 | 10 | 10 | 10 | 10 | 10 | — | ≧99.991 | 40.3 | 2–3 | 4.6 |
| Ex. 45 | 50 | 30 | 20 | 10 | 10 | 10 | 10 | 10 | — | ≧99.984 | 40.5 | 1–2 | 4.8 |
| Ex. 46 | 10 | — | — | — | — | — | — | — | 1 | ≧99.9979 | 39.0 | 2–3 | 4.6 |
| Ex. 47 | 10 | — | — | — | — | — | — | — | 10 | ≧99.997 | 40.8 | 2–3 | 4.9 |
| Ex. 48 | 10 | 50 | — | — | — | — | — | — | 1 | ≧99.9929 | 39.3 | 2–3 | 4.5 |
| Ex. 49 | 10 | 50 | — | — | — | — | — | — | 10 | ≧99.992 | 41.5 | 2–3 | 5.0 |
| Ex. 50 | 10 | — | — | — | — | 50 | — | — | 1 | ≧99.9929 | 40.2 | 2–3 | 4.5 |
| Ex. 51 | 10 | — | — | — | — | 50 | — | — | 10 | ≧99.992 | 39.8 | 2–3 | 4.7 |
| Ex. 52 | 10 | 25 | 25 | — | — | — | — | — | 1 | ≧99.9929 | 40.4 | 2–3 | 4.6 |
| Ex. 53 | 10 | 25 | 25 | — | — | — | — | — | 10 | ≧99.992 | 41.6 | 2–3 | 4.9 |
| Ex. 54 | 10 | — | 10 | 10 | 10 | 10 | — | — | 1 | ≧99.9939 | 39.7 | 2–3 | 4.8 |
| Ex. 55 | 10 | — | 10 | 10 | 10 | 10 | — | — | 10 | ≧99.993 | 40.8 | 2–3 | 5.0 |
| Ex. 56 | 10 | — | — | — | — | — | — | — | — | ≧99.998 | 33.0 | 3–3 | 3.2 |
| Ex. 57 | 10 | — | — | — | — | — | — | — | — | ≧99.998 | 59.8 | 2–3 | 3.5 |
| Ex. 58 | 10 | — | 50 | — | — | — | — | — | — | ≧99.993 | 33.1 | 2–3 | 3.9 |
| Ex. 59 | 10 | — | 50 | — | — | — | — | — | — | ≧99.993 | 60.1 | 2–3 | 4.6 |
| Ex. 60 | 10 | — | — | — | — | 50 | — | — | — | ≧99.993 | 33.2 | 2–3 | 3.9 |

TABLE 4

| | Composition | | | | | | | | | | Mechanical strength | | Evaluation |
| | (wt ppm) | | | | | | | | | (wt %) | Tensile | | High temperature |
| Ex. No. | Ca | Mg | Y | La | Eu | Ge | Ag | Pt | Be | Au | strength (kg/mm$^2$) | Elongation (%) | bond strength (g) |
|---|---|---|---|---|---|---|---|---|---|---|---|---|---|
| Ex. 61 | 10 | — | — | — | — | 50 | — | — | — | ≧99.993 | 59.8 | 2–3 | 5.1 |
| Ex. 62 | 10 | 25 | 25 | — | — | — | — | — | — | ≧99.993 | 33.0 | 2–3 | 3.8 |
| Ex. 63 | 10 | 25 | 25 | — | — | — | — | — | — | ≧99.993 | 60.1 | 2–3 | 4.9 |
| Ex. 64 | 10 | — | — | — | 25 | 25 | — | — | — | ≧99.993 | 33.3 | 2–3 | 3.9 |
| Ex. 65 | 10 | — | — | — | 25 | 25 | — | — | — | ≧99.993 | 60.3 | 2–3 | 4.6 |
| Ex. 66 | 10 | — | — | — | 20 | 20 | 20 | — | — | ≧99.992 | 33.1 | 2–3 | 3.9 |
| Ex. 67 | 10 | — | — | — | 20 | 20 | 20 | — | — | ≧99.992 | 60.2 | 2–3 | 4.8 |
| Ex. 68 | 10 | — | 10 | 10 | 10 | 10 | — | — | — | ≧99.994 | 33.1 | 2–3 | 3.8 |
| Ex. 69 | 10 | — | 10 | 10 | 10 | 10 | — | — | — | ≧99.994 | 59.8 | 2–3 | 5.1 |

TABLE 5

| Com. Ex. No. | Composition (wt ppm) | | | | | | | | (wt %) | Mechanical strength | | Evaluation |
|---|---|---|---|---|---|---|---|---|---|---|---|---|
| | Ca | Mg | Y | La | Eu | Ge | Ag | Cu | Au | Tensile strength (kg/mm$^2$) | Elongation (%) | High temperature bond strength (g) |
| Com. Ex. 1 | — | — | — | — | — | — | — | — | ≧99.999 | 16.2 | 2–3 | 0.6 |
| Com. Ex. 2 | — | 50 | — | — | — | — | — | — | ≧99.994 | 40.1 | 2–3 | 2.7 |
| Com. Ex. 3 | — | — | 50 | — | — | — | — | — | ≧99.994 | 40.9 | 2–3 | 2.5 |
| Com. Ex. 4 | 10 | — | — | — | — | — | — | 2.0 | ≧97.998 | 59.3 | 2–3 | 0.5 |
| Com. Ex. 5 | 200 | — | — | — | — | — | — | — | ≧99.979 | 40.4 | 2–3 | 1.2 |
| Com. Ex. 6 | 10 | — | — | — | — | — | — | — | ≧99.998 | 30.1 | 2–3 | 2.5 |
| Com. Ex. 7 | 10 | 50 | — | — | — | — | — | — | ≧99.993 | 29.8 | 2–3 | 2.8 |
| Com. Ex. 8 | 10 | — | — | — | — | 25 | 25 | — | ≧99.993 | 30.4 | 2–3 | 2.8 |
| Com. Ex. 9 | 10 | — | — | — | — | — | — | — | ≧99.998 | 23.2 | 4 | 2.2 |
| Com. Ex. 10 | 10 | — | 50 | — | — | — | — | — | ≧99.993 | 22.8 | 4 | 2.2 |
| Com. Ex. 11 | 30 | — | 20 | — | 50 | — | — | — | ≧99.989 | 37.0 | 4 | 2.4 |

(Consideration of Results of Examples 1 to 71 and Comparative Examples 1 to 11)

(1) In Examples 1 to 4 in which 1 to 100 ppm by weight of Ca only was added to a high purity gold, and the resultant gold alloy wire had a gold purity of more than 99.9% by weight, a elongation of 2 to 3% and an tensile strength of 39.3 to 41.4 kg/mm$^2$, the high temperature bond strengths of the wires were excellent at 3.0 to 3.3 g.

Among them, addition of 1 to 50 ppm by weight of Ca is preferred since the high temperature bond strengths of the wires are 3.2 to 3.3 g.

(2) In Examples 5 to 55 in which 1 to 100 ppm by weight of Ca as well as 1 to 100 ppm by weight of at least one of Mg, Y, La, Eu, Ge, Ag, Pt and Be were added to a high purity gold, and the resultant gold alloy wire had a gold purity of more than 99.9% by weight, an elongation of 1 to 3% and a tensile strength of 39.3 to 41.6 kg/mm$^2$, the high temperature bond strengths of the wires were 4.2 to 5.1 g, which were more excellent than when only Ca was added.

(3) In Examples 56 to 71 in which the composition and the elongation are the same as those of Examples 2, 11, 22, 26, 36, 42, 43 and 45 and the tensile strength thereof was 33.0 to 60.0 kg/mm$^2$, the high temperature bond strengths of the wires were excellent at 3.2 to 5.1 g.

(4) The most excellent high temperature bond strength of the wire among Examples, 4.2 to 5.1 g, was obtained when at least one of Mg, Y, La, Eu, Ge, Ag, Pt and Be in addition to Ca were added and the wire had an elongation of 1 to 3% and a tensile strength of 39.1 to 63.0 kg/mm$^2$.

(5) In Comparative Example 1 where both Ca and at least one of Mg, Y, La, Eu, Ge, Ag, Pt and Be were not added, the high temperature bond strength of the wire was low at 0.6 g.

(6) In Comparative Examples 2 to 3 where Ca was not contained and 50 ppm by weight of Mg or Y was contained, the high temperature bond strength of the wire was low at 2.5 to 2.7 g.

(7) In Comparative Example 4 where 10 ppm by weight of Ca was added and the predetermined elongation and tensile strength were established but 2.0% by weight of Cu was contained, the high temperature bond strength of the wire was low at 0.5 g.

(8) In Comparative Example 5 where 200 ppm by weight of Ca was contained, the high temperature bond strength of the wire was low, 1.2 g.

(9) In Comparative Examples 6 to 8 where a predetermined amount of Ca or a predetermined amount of Ca together with a predetermined amount of Mg, Ge or Ag, were contained and the wire had a predetermined gold purity and a predetermined elongation but tensile strength thereof was less than 33.4 kg/mm$^2$, the high temperature bond strength of the wire was low at 2.5 to 2.8 g.

(10) In Comparative Examples 9 to 11 where a predetermined amount of Ca or a predetermined amount of Ca together with a predetermined amount of Mg, Ge or Ag, were contained and the wire had a predetermined gold purity but the elongation thereof was beyond 3%, the high temperature bond strength of the wire was low at 2.2 to 2.4 g.

(Example 101)

Example 1 was repeated, except that not only 1 ppm by weight of Ca but also 1.0% by weight of Pd were added to the starting high purity gold with a 99.999% purity and the wire obtained after the final annealing had a tensile strength of 39.8 kg/mm$^2$ and an elongation of 2 to 3%. The composition and the mechanical properties of the obtained gold alloy wire are shown in Table 6.

The high temperature bond strength of the wire was measured in the same manner as in Example 1 and is shown in Table 6.

(Examples 102 to 150 and Comparative Examples 101 to 126)

Example 101 was repeated but the compositions of the gold and gold alloy wire, the elongation and the tensile strength were changed as shown in Tables 5 to 9. The high temperature bond strength measured for the obtained wire are shown in Tables 6 to 10.

TABLE 6

| Ex. No. | Composition (wt ppm) | | | | | | | Composition (wt %) | | | | Au | Mechanical strength Tensile strength (kg/mm²) | Elongation (%) | Evaluation High temperature bond strength (g) |
|---|---|---|---|---|---|---|---|---|---|---|---|---|---|---|---|
| | Ca | Mg | Y | La | Eu | Ge | Be | Pd | Ag | Pt | impurities | | | | |
| Ex. 101 | 1 | — | — | — | — | — | — | 1.0 | — | — | ≦0.002 | balance | 39.8 | 2–3 | 4.3 |
| Ex. 102 | 10 | — | — | — | — | — | — | 1.0 | — | — | ≦0.002 | balance | 40.2 | 2–3 | 4.5 |
| Ex. 103 | 50 | — | — | — | — | — | — | 1.0 | — | — | ≦0.002 | balance | 39.1 | 2–3 | 4.8 |
| Ex. 104 | 100 | — | — | — | — | — | — | 1.0 | — | — | ≦0.002 | balance | 40.7 | 2–3 | 3.5 |
| Ex. 105 | 50 | — | — | — | — | — | — | 0.2 | — | — | ≦0.002 | balance | 40.2 | 2–3 | 4.6 |
| Ex. 106 | 50 | — | — | — | — | — | — | 5.0 | — | — | ≦0.002 | balance | 41.5 | 2–3 | 4.1 |
| Ex. 107 | 1 | — | — | — | — | — | — | — | 1.0 | — | ≦0.002 | balance | 39.8 | 2–3 | 4.4 |
| Ex. 108 | 10 | — | — | — | — | — | — | — | 1.0 | — | ≦0.002 | balance | 40.1 | 2–3 | 4.5 |
| Ex. 109 | 50 | — | — | — | — | — | — | — | 1.0 | — | ≦0.002 | balance | 40.0 | 2–3 | 4.8 |
| Ex. 110 | 100 | — | — | — | — | — | — | — | 1.0 | — | ≦0.002 | balance | 40.4 | 2–3 | 3.6 |
| Ex. 111 | 50 | — | — | — | — | — | — | — | 0.2 | — | ≦0.002 | balance | 41.4 | 2–3 | 4.5 |
| Ex. 112 | 50 | — | — | — | — | — | — | — | 5.0 | — | ≦0.002 | balance | 39.7 | 2–3 | 4.1 |
| Ex. 113 | 1 | — | — | — | — | — | — | — | — | 1.0 | ≦0.002 | balance | 40.7 | 2–3 | 4.6 |
| Ex. 114 | 10 | — | — | — | — | — | — | — | — | 1.0 | ≦0.002 | balance | 40.2 | 2–3 | 5.0 |
| Ex. 115 | 50 | — | — | — | — | — | — | — | — | 1.0 | ≦0.002 | balance | 41.3 | 2–3 | 5.0 |
| Ex. 116 | 109 | — | — | — | — | — | — | — | — | 1.0 | ≦0.002 | balance | 39.2 | 2–3 | 3.5 |
| Ex. 117 | 50 | — | — | — | — | — | — | — | — | 0.2 | ≦0.002 | balance | 40.3 | 2–3 | 4.6 |
| Ex. 118 | 50 | — | — | — | — | — | — | — | — | 5.0 | ≦0.002 | balance | 39.9 | 2–3 | 4.2 |
| Ex. 119 | 50 | — | — | — | — | — | — | 1.0 | 1.0 | — | ≦0.002 | balance | 40.8 | 2–3 | 4.4 |
| Ex. 120 | 50 | — | — | — | — | — | — | 1.0 | — | 1.0 | ≦0.002 | balance | 39.6 | 2–3 | 4.9 |

TABLE 7

| Ex. No. | Composition (wt ppm) | | | | | | | Composition (wt %) | | | | Au | Mechanical strength Tensile strength (kg/mm²) | Elongation (%) | Evaluation High temperature bond strength (g) |
|---|---|---|---|---|---|---|---|---|---|---|---|---|---|---|---|
| | Ca | Mg | Y | La | Eu | Ge | Be | Pd | Ag | Pt | impurities | | | | |
| Ex. 121 | 50 | — | — | — | — | — | — | — | 1.0 | 1.0 | ≦0.002 | balance | 39.8 | 2–3 | 4.2 |
| Ex. 122 | 50 | — | — | — | — | — | — | 1.0 | 1.0 | 1.0 | ≦0.002 | balance | 40.2 | 2–3 | 5.1 |
| Ex. 123 | 50 | — | — | — | — | — | — | 1.0 | — | — | ≦0.002 | balance | 39.8 | 2–3 | 4.8 |
| Ex. 124 | 50 | 1 | — | — | — | — | — | 1.0 | — | — | ≦0.002 | balance | 40.2 | 2–3 | 4.7 |
| Ex. 125 | 50 | 50 | — | — | — | — | — | 1.0 | — | — | ≦0.002 | balance | 39.8 | 2–3 | 4.9 |
| Ex. 126 | 50 | 100 | — | — | — | — | — | 1.0 | — | — | ≦0.002 | balance | 41.5 | 2–3 | 4.9 |
| Ex. 127 | 50 | — | 1 | — | — | — | — | 1.0 | — | — | ≦0.002 | balance | 40.1 | 2–3 | 4.8 |
| Ex. 128 | 50 | — | 50 | — | — | — | — | 1.0 | — | — | ≦0.002 | balance | 41.0 | 2–3 | 5.1 |
| Ex. 129 | 50 | — | 100 | — | — | — | — | 1.0 | — | — | ≦0.002 | balance | 40.5 | 2–3 | 5.0 |
| Ex. 130 | 50 | — | — | 50 | — | — | — | 1.0 | — | — | ≦0.002 | balance | 39.7 | 2–3 | 4.9 |
| Ex. 131 | 50 | — | — | — | 50 | — | — | 1.0 | — | — | ≦0.002 | balance | 41.3 | 2–3 | 4.8 |
| Ex. 132 | 50 | — | — | — | — | 50 | — | 1.0 | — | — | ≦0.002 | balance | 40.4 | 2–3 | 5.0 |
| Ex. 133 | 50 | — | — | — | — | — | 50 | 1.0 | — | — | ≦0.002 | balance | 40.5 | 2–3 | 4.6 |
| Ex. 134 | 50 | 25 | 25 | — | — | — | — | 1.0 | — | — | ≦0.002 | balance | 41.2 | 2–3 | 4.9 |
| Ex. 135 | 50 | — | — | 25 | 25 | — | — | 1.0 | — | — | ≦0.002 | balance | 40.1 | 2–3 | 5.0 |
| Ex. 136 | 50 | — | 10 | 10 | 10 | 10 | — | 1.0 | — | — | ≦0.002 | balance | 39.7 | 2–3 | 4.7 |
| Ex. 137 | 50 | 10 | 10 | 10 | 10 | 10 | 10 | 1.0 | — | — | ≦0.002 | balance | 39.2 | 2–3 | 4.9 |
| Ex. 138 | 50 | 25 | 25 | — | — | — | — | — | 1.0 | — | ≦0.002 | balance | 41.1 | 2–3 | 4.8 |
| Ex. 139 | 50 | 25 | 25 | — | — | — | — | — | — | 1.0 | ≦0.002 | balance | 39.6 | 2–3 | 4.5 |
| Ex. 140 | 50 | 25 | — | — | — | — | — | 1.0 | 1.0 | — | ≦0.002 | balance | 40.4 | 2–3 | 4.4 |

TABLE 8

| Ex. No. | Composition (wt ppm) | | | | | | | Composition (wt %) | | | | Au | Mechanical strength Tensile strength (kg/mm²) | Elongation (%) | Evaluation High temperature bond strength (g) |
|---|---|---|---|---|---|---|---|---|---|---|---|---|---|---|---|
| | Ca | Mg | Y | La | Eu | Ge | Be | Pd | Ag | Pt | impurities | | | | |
| Ex. 141 | 50 | 25 | — | — | — | — | — | 1.0 | — | 1.0 | ≦0.002 | balance | 39.6 | 2–3 | 4.3 |
| Ex. 142 | 50 | 25 | — | — | — | — | — | 1.0 | 1.0 | 1.0 | ≦0.002 | balance | 41.1 | 2–3 | 4.8 |
| Ex. 143 | 50 | — | — | — | — | — | — | 1.0 | — | — | ≦0.002 | balance | 33.2 | 2–3 | 3.8 |
| Ex. 144 | 50 | — | — | — | — | — | — | 1.0 | — | — | ≦0.002 | balance | 60.4 | 2–3 | 4.4 |

TABLE 8-continued

| | Composition | | | | | | | | | | | Mechanical strength | | Evaluation |
|---|---|---|---|---|---|---|---|---|---|---|---|---|---|---|
| | (wt ppm) | | | | | | | (wt %) | | | | Tensile strength | Elongation | High temperature bond strength |
| Ex. No. | Ca | Mg | Y | La | Eu | Ge | Be | Pd | Ag | Pt | impurities | Au | (kg/mm²) | (%) | (g) |
| Ex. 145 | 50 | — | — | — | — | — | — | — | 1.0 | — | ≦0.002 | balance | 33.1 | 2–3 | 3.9 |
| Ex. 146 | 50 | — | — | — | — | — | — | — | 1.0 | — | ≦0.002 | balance | 59.8 | 2–3 | 4.2 |
| Ex. 147 | 50 | — | — | — | — | — | — | — | — | 1.0 | ≦0.002 | balance | 33.0 | 2–3 | 3.8 |
| Ex. 148 | 50 | — | — | — | — | — | — | — | — | 1.0 | ≦0.002 | balance | 59.7 | 2–3 | 4.0 |
| Ex. 149 | 50 | 50 | — | — | — | — | — | 1.0 | — | — | ≦0.002 | balance | 33.1 | 2–3 | 3.9 |
| Ex. 150 | 50 | 50 | — | — | — | — | — | 1.0 | — | — | ≦0.002 | balance | 60.6 | 2–3 | 4.3 |
| Ex. 151 | 50 | 30 | 30 | 10 | 10 | 10 | 10 | 1.0 | — | — | ≦0.002 | balance | 39.5 | 1–2 | 4.7 |

TABLE 9

| | Composition | | | | | | | | Mechanical strength | | Evaluation |
|---|---|---|---|---|---|---|---|---|---|---|---|
| | (wt ppm) | | | | | (wt %) | | | Tensile strength | Elongation | High temperature bond strength |
| Com. Ex. No. | Ca | Mg | Pd | Ag | Pt | Cu | impurities | Au | (kg/mm²) | (%) | (g) |
| Com. Ex. 101 | —* | — | —* | — | — | — | ≦0.002 | balance | 16.2 | 2–3 | 0.6 |
| Com. Ex. 102 | —* | — | 1.0 | — | — | — | ≦0.002 | balance | 40.2 | 2–3 | 2.7 |
| Com. Ex. 103 | —* | — | — | 1.0 | — | — | ≦0.002 | balance | 40.3 | 2–3 | 2.8 |
| Com. Ex. 104 | —* | — | — | — | 1.0 | — | ≦0.002 | balance | 39.7 | 2–3 | 2.5 |
| Com. Ex. 105 | —* | 50 | 1.0 | — | — | — | ≦0.002 | balance | 40.9 | 2–3 | 2.8 |
| Com. Ex. 106 | 50 | — | — | — | — | 2.0* | ≦0.002 | balance | 58.6 | 2–3 | 0.5 |
| Com. Ex. 107 | 200* | — | 1.0 | — | — | — | ≦0.002 | balance | 39.8 | 2–3 | 1.0 |
| Com. Ex. 108 | 200* | — | — | 1.0 | — | — | ≦0.002 | balance | 40.0 | 2–3 | 1.3 |
| Com. Ex. 109 | 200* | — | — | — | 1.0 | — | ≦0.002 | balance | 40.3 | 2–3 | 1.1 |
| Com. Ex. 110 | 200* | 50 | 1.0 | — | — | — | ≦0.002 | balance | 39.6 | 2–3 | 1.4 |
| Com. Ex. 111 | 50 | — | 0.11* | — | — | — | ≦0.002 | balance | 40.2 | 2–3 | 3.3 |
| Com. Ex. 112 | 50 | — | — | 0.11* | — | — | ≦0.002 | balance | 39.7 | 2–3 | 3.2 |
| Com. Ex. 113 | 50 | — | — | — | 0.11* | — | ≦0.002 | balance | 39.9 | 2–3 | 3.2 |
| Com. Ex. 114 | 50 | 50 | 0.11* | — | — | — | ≦0.002 | balance | 40.4 | 2–3 | 3.3 |
| Com. Ex. 115 | 50 | — | 6.0* | — | — | — | ≦0.002 | balance | 40.7 | 2–3 | 1.6 |

TABLE 10

| | Composition | | | | | | | | Mechanical strength | | Evaluation |
|---|---|---|---|---|---|---|---|---|---|---|---|
| | (wt ppm) | | | | | (wt %) | | | Tensile strength | Elongation | High temperature bond strength |
| Com. Ex. No. | Ca | Mg | Pd | Ag | Pt | Cu | impurities | Au | (kg/mm²) | (%) | (g) |
| Com. Ex. 116 | 50 | — | — | 6.0* | — | — | ≦0.002 | balance | 40.1 | 2–3 | 1.4 |
| Com. Ex. 117 | 50 | — | — | — | 6.0* | — | ≦0.002 | balance | 40.6 | 2–3 | 1.4 |
| Com. Ex. 118 | 50 | 50 | 6.0* | — | — | — | ≦0.002 | balance | 40.5 | 2–3 | 1.2 |
| Com. Ex. 119 | 50 | — | 1.0 | — | — | — | ≦0.002 | balance | 30.3* | 2–3 | 2.8 |
| Com. Ex. 120 | 50 | — | — | 1.0 | — | — | ≦0.002 | balance | 29.9* | 2–3 | 2.6 |
| Com. Ex. 121 | 50 | — | — | — | 1.0 | — | ≦0.002 | balance | 30.1* | 2–3 | 2.6 |
| Com. Ex. 122 | 50 | 50 | 1.0 | — | — | — | ≦0.002 | balance | 30.6* | 2–3 | 2.9 |
| Com. Ex. 123 | 50 | — | 1.0 | — | — | — | ≦0.002 | balance | 40.8 | 4* | 2.3 |
| Com. Ex. 124 | 50 | — | — | 1.0 | — | — | ≦0.002 | balance | 39.4 | 4* | 2.1 |
| Com. Ex. 125 | 50 | — | — | — | 1.0 | — | ≦0.002 | balance | 40.8 | 4* | 2.0 |
| Com. Ex. 126 | 50 | 50 | 1.0 | — | — | — | ≦0.002 | balance | 40.2 | 4* | 2.4 |

(Consideration of Results of Examples 101 to 150 and Comparative Examples 101 to 126)

(1) In Examples 101 to 123 in which 1 to 100 ppm by weight of Ca and 0.2 to 5.0% by weight of at least one of Pd, Ag and Pt were added to a high purity gold, and the resultant gold alloy wire had an elongation of 2 to 3% and an tensile strength of 39.1 to 41.5 kg/mm², the high temperature bond strengths of the wires were excellent at 3.5 to 5.1 g. Among them, addition of 1 to 50 ppm by weight of Ca is preferred since the high temperature bond strengths of the wires are 4.1 to 5.1 g.

(2) In Examples 124 to 142 in which in addition to predetermined amounts of Ca and at least one of Pd, Ag and Pt, 1 to 100 ppm by weight of at least one of Mg, Y, La, Eu, Ge and Be was further added to a high purity gold, and the resultant gold alloy wire had an elongation of 2 to 3% and a tensile strength of 39.2 to 41.5 kg/mm², the high temperature bond strengths of the wires were 4.3 to 5.1 g, which was similarly excellent.

(3) In Examples 143 to 150 in which the composition and the elongation are the same as those of Examples 103, 109, 115 and 125 and the tensile strength thereof was 33.0 to 60.0 kg/mm², the high temperature bond strengths of the wires were excellent at 3.8 to 4.4 g.

(4) In Comparative Example 101 which was the same as Comparative Example 1 where both Ca and at least one of Pa, Ag and Pt were not added, the high temperature bond strength of the wire was low at 0.6 g.

(5) In Comparative Examples 102 to 105 where Ca was not contained and a predetermined amount of at least one of Pd, Ag and Pt was contained, the high temperature bond strength of the wires were low at 2.5 to 2.8 g.

(6) In Comparative Example 106 where 50 ppm by weight of Ca was added but 2.0% by weight of Cu was contained in place of at least one of Pd, Ag and Pt, the high temperature bond strengths of the wires were low at 0.5 g.

(7) In Comparative Examples 107 to 110 where a predetermined amount of at least one of Pd, Ag and Pt was contained but 200 ppm by weight of Ca was contained, the high temperature bond strengths of the wires were low at 1.0 to 1.4 g.

(8) In Comparative Examples 111 to 114 where a predetermined amount of Ca was contained but 0.11% by weight of at least one of Pd, Ag and Pt was contained, the high temperature bond strengths of the wires were low at 3.2 to 3.3 g.

(9) In Comparative Examples 115 to 118 where a predetermined amount of Ca was contained but 6.0% by weight of at least one of Pd, Ag and Pt was contained, the high temperature bond strengths of the wires were low at 1.2 to 1.6 g.

(10) In Comparative Examples 119 to 122 where a predetermined amount of Ca and a predetermined amount of at least one of Pd, Ag and Pt were contained and the wire had a predetermined elongation but tensile strength was less than 33.0 kg/mm², the high temperature bond strengths of the wires were low at 2.6 to 2.9 g.

(11) In Comparative Examples 123 to 126 where a predetermined amount of Ca and a predetermined amount of at least one of Pd, Ag and Pt were contained and the wire had a predetermined tensile strength but the elongation thereof was beyond 3%, the high temperature bond strength of the wires were low at 2.0 to 2.4 g.

We claim:

1. A method for wedge bonding, comprising the steps of:

providing a gold alloy wire comprising 1 to 100 parts per million by weight of Ca, the remainder being gold, said gold alloy wire having a gold purity of at least 99.99% by weight wherein the tensile strength of the gold alloy wire is adjusted to not less than 33.0 kg/mm² and the room temperature elongation of the gold alloy wire is adjusted to 1 to 3% by controlling the degree of cold wiring and annealing of the gold alloy wire;

press bonding an end of the gold alloy wire to an electrode of a semiconductor chip with a wedge bonding tool; and press bonding another end of the gold alloy wire to a lead or another electrode with a wedge bonding tool.

2. The method according to claim 1, comprising the steps of:

arranging a portion of the gold alloy wire under a wedge bonding tool;

pressing said portion of said gold alloy wire to an electrode of a semiconductor chip by said wedge bonding tool to bond said portion of said gold alloy wire to said electrode;

relatively moving said wedge bonding tool with said gold alloy wire through a position above said electrode of said semiconductor chip toward a position above a lead or another electrode, to form the gold alloy wire in a certain shape from said electrode to said lead or another electrode, another portion of said gold alloy wire existing under said wedge-shape tool; and pressing said another portion of said gold alloy wire to said lead or another electrode by said wedge bonding tool to bond said another portion of said gold alloy wire to said lead or another electrode.

3. The method according to claim 1, wherein said electrode is of aluminum.

4. The method according to claim 2, wherein ultrasonic waves are applied during said pressing steps.

5. The method according to claim 1, wherein said gold alloy wire comprises 1 to 100 parts per million by weight of Ca, the remainder being gold, said gold alloy wire having a purity of gold of at least 99.99% by weight, said gold alloy wire having a tensile strength of not less than 33.0 kg/mm and an elongation of 1 to 3%.

6. The method according to claim 5, wherein said gold alloy wire further comprises at least one element selected from the group consisting of Mg, Y, La, Eu, Ge, Ag and Pt in an amount of 1 to 100 parts per million by weight.

7. The method according to claim 5, wherein said gold alloy wire further comprises Be in an amount of 1 to 20 parts per million by weight.

8. The method according to claim 6, wherein said gold alloy wire further comprises Be in an amount of 1 to 20 parts per million by weight.

9. A method for wedge bonding, comprising the steps of:

providing a gold alloy wire comprising 1 to 100 parts per million by weight of Ca and 0.2 to 5.0% by weight of at least one element selected from the group consisting of Pd, Ag and Pt, the remainder being gold and inevitable impurities, said gold alloy wire having a gold purity of at least 99.99% by weight, wherein the tensile strength of the gold alloy wire is adjusted to not less than 33.0 kg/mm² and the room temperature elongation of the gold alloy wire is adjusted to I to 3% by controlling the degree of cold wiring and annealing of the gold alloy wire;

press bonding an end of the gold alloy wire to an electrode of a semiconductor chip with a wedge bonding tool; and press bonding another end of the gold alloy wire to a lead or another electrode with a wedge bonding tool.

10. The method according to claim 9, wherein said gold alloy wire further comprises at least one element selected from the group consisting of Mg, Y, La, Eu, Ge and Be in an amount of 1 to 100 parts per million by weight.

11. The method according to claim 1, where said press bonding steps are carried out at room temperature.

* * * * *

UNITED STATES PATENT AND TRADEMARK OFFICE
CERTIFICATE OF CORRECTION

PATENT NO. : 5,945,065
DATED : August 31, 1999
INVENTOR(S) : Teruo Kikuchi; Mitsuyoshi Ishii It is certified that error appears in the above-identified patent and that said Letters Patent is hereby corrected as shown below:

Column 1, lines 13,14, replace "a ultrasonic" with -- an ultrasonic -- (both occurrences).
Column 1, line 32, after "(wire 2) delete "toward".
Column 1, line 55, after "(wire 12')" delete "to".
Column 8, line 12, replace "IC ship" with -- IC chip --.
Columns 7,8, TABLE 2, under "Ex. No." replace "Ex. 10" with -- Ex. 21 --.
Column 11, line 27, replace "a elongation of 2 to 3% and an tensile" with an elongation of 2 to 3% and a tensile --.
Column 12, line 46, replace "Example 1" with -- Example 101 --.
Columns 13,14, TABLE 6, under "(kg/mm$^2$)" in "Ex. 111" replace "41.4" with -- 41.1 --.
Columns 13,14, TABLE 6, under the column "Ca" in "Ex. 116" replace "109" with -- 100 --.
Column 15, 65, replace "an tensile" with -- a tensile --.
Column 18, line 14, replace "wedge-shape" with -- wedge-shaped --.
Column 18, line 28, replace "33.0 kg/mm" with -- 33.0 kg/mm$^2$ --.
Column 18, line 50, replace "I to 3%" with -- 1 to 3% --.

Signed and Sealed this

Twenty-ninth Day of May, 2001

Attest:

NICHOLAS P. GODICI

Attesting Officer     Acting Director of the United States Patent and Trademark Office